United States Patent
Bravo et al.

(10) Patent No.: US 11,967,486 B2
(45) Date of Patent: Apr. 23, 2024

(54) SUBSTRATE PROCESSING SYSTEM INCLUDING DUAL ION FILTER FOR DOWNSTREAM PLASMA

(71) Applicant: LAM RESEARCH CORPORATION, Fremont, CA (US)

(72) Inventors: Andrew Stratton Bravo, Piedmont, CA (US); Chih-Hsun Hsu, Cupertino, CA (US); Serge Kosche, San Francisco, CA (US); Stephen Whitten, Danville, CA (US); Shih-Chung Kon, Fremont, CA (US); Mark Kawaguchi, San Carlos, CA (US); Himanshu Chokshi, Fremont, CA (US); Dan Zhang, Fremont, CA (US); Gnanamani Amburose, Fremont, CA (US)

(73) Assignee: LAM RESEARCH CORPORATION, Fremont, CA (US)

(*) Notice: Subject to any disclaimer, the term of this patent is extended or adjusted under 35 U.S.C. 154(b) by 336 days.

(21) Appl. No.: 17/424,381

(22) PCT Filed: Jan. 21, 2020

(86) PCT No.: PCT/US2020/014329
§ 371 (c)(1),
(2) Date: Jul. 20, 2021

(87) PCT Pub. No.: WO2020/154244
PCT Pub. Date: Jul. 30, 2020

(65) Prior Publication Data
US 2022/0076924 A1 Mar. 10, 2022

Related U.S. Application Data

(60) Provisional application No. 62/795,814, filed on Jan. 23, 2019.

(51) Int. Cl.
*H01J 37/32* (2006.01)

(52) U.S. Cl.
CPC ...... *H01J 37/32422* (2013.01); *H01J 37/321* (2013.01); *H01J 37/32357* (2013.01); *H01J 37/32467* (2013.01); *H01J 37/32174* (2013.01)

(58) Field of Classification Search
CPC .............. H01J 37/32422; H01J 37/321; H01J 37/32357; H01J 37/32467; H01J 37/32174; H01J 37/3244; H01J 37/32715
See application file for complete search history.

(56) References Cited

U.S. PATENT DOCUMENTS 10,079,176 B2 9/2018 Lee
10,825,659 B2 11/2020 Treadwell et al.
(Continued)

FOREIGN PATENT DOCUMENTS

| CN | 104465457 B | | 9/2018 | |
| CN | 109247031 A | * | 1/2019 | ............... G21B 1/00 |
| WO | WO-2018094064 A1 | | 5/2018 | |

OTHER PUBLICATIONS

International Search Report and Written Opinion of the ISA issued in PCT/US2020/014329, dated May 21, 2020; ISA/KR.

*Primary Examiner* — Abdullah A Riyami
*Assistant Examiner* — Syed M Kaiser

(57) ABSTRACT

A substrate processing system includes an upper chamber and a gas delivery system to supply a gas mixture to the upper chamber. An RF generator generates plasma in the upper chamber. A lower chamber includes a substrate support. A dual ion filter is arranged between the upper chamber and the lower chamber. The dual ion filter includes an upper filter including a first plurality of through holes configured to filter ions. A lower filter includes a second plurality of through holes configured to control plasma uniformity.

15 Claims, 6 Drawing Sheets

(56) References Cited

U.S. PATENT DOCUMENTS

| | | | |
|---|---|---|---|
| 10,957,561 B2 | 3/2021 | Drewery et al. | |
| 2011/0062872 A1* | 3/2011 | Jin | H05B 45/46 |
| | | | 257/E21.531 |
| 2012/0074951 A1* | 3/2012 | Chen | H01J 37/32183 |
| | | | 324/509 |
| 2014/0370259 A1* | 12/2014 | Edwards | C23C 18/32 |
| | | | 427/404 |
| 2016/0093472 A1* | 3/2016 | Angelov | H01J 37/32357 |
| | | | 118/723 R |
| 2017/0330728 A1* | 11/2017 | Bravo | H01J 37/32082 |
| 2017/0372899 A1* | 12/2017 | Yang | H01L 21/02274 |
| 2018/0122638 A1* | 5/2018 | Jung | H01L 21/67 |
| 2018/0174870 A1* | 6/2018 | Yang | H01J 37/32449 |
| 2018/0269067 A1* | 9/2018 | Kuyel | C23C 16/303 |
| 2018/0342374 A1* | 11/2018 | Liang | H01J 37/3211 |
| 2019/0057862 A1* | 2/2019 | Yang | C23C 16/505 |

* cited by examiner

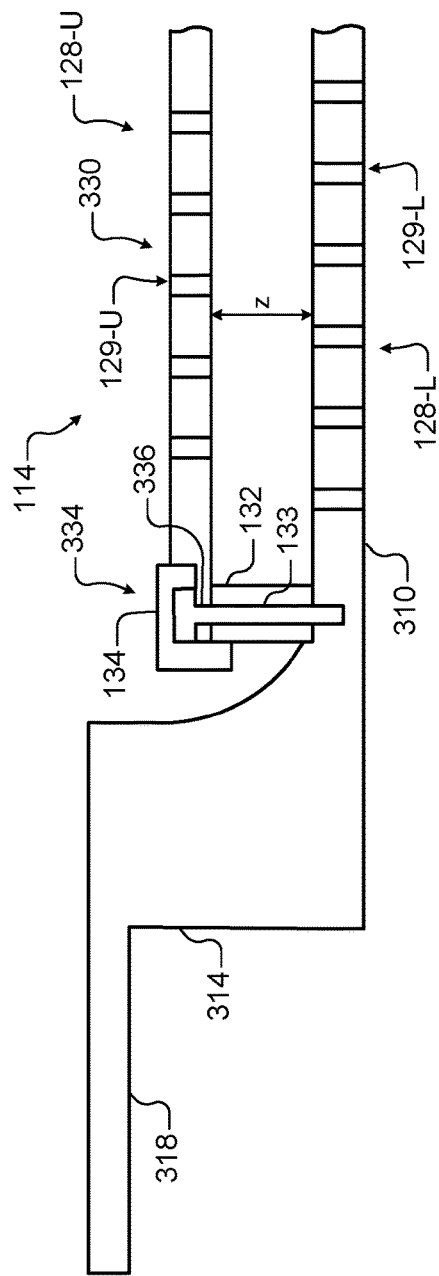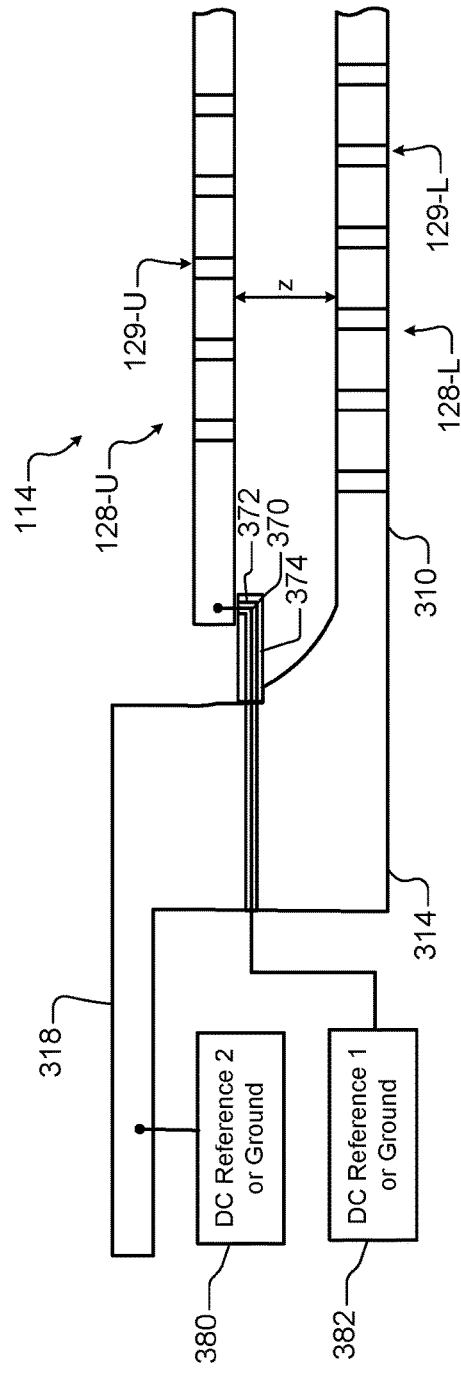

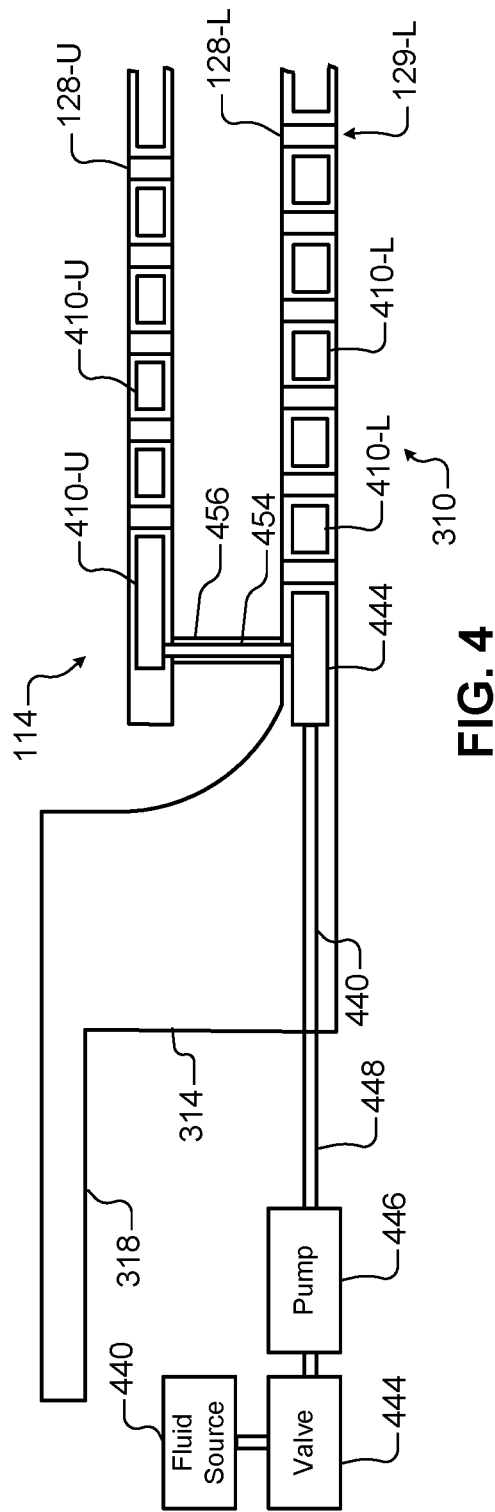

SUBSTRATE PROCESSING SYSTEM INCLUDING DUAL ION FILTER FOR DOWNSTREAM PLASMA

CROSS-REFERENCE TO RELATED APPLICATIONS

This application is a U.S. National Phase Application under 35 U.S.C. 371 of International Application No. PCT/US2020/014329, filed on Jan. 21, 2020, which claims the benefit of U.S. Provisional Application No. 62/795,814, filed on Jan. 23, 2019. The entire disclosures of the applications referenced above are incorporated herein by reference.

FIELD

The present disclosure relates to substrate processing systems, and more particularly to a substrate processing system including an ion filter.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform treatments on substrates such as semiconductor wafers. Examples of the treatments include deposition, etching, cleaning, etc. The substrate processing systems typically include a processing chamber including a substrate support, a gas delivery system and a plasma generator.

During processing, the substrate is arranged on the substrate support. Different gas mixtures may be introduced by the gas delivery system into the processing chamber. In some applications, radio frequency (RF) plasma such as inductively coupled plasma (ICP) may be used to activate chemical reactions.

ICP produces both highly reactive neutral species and ions to modify wafer surfaces. As customer devices become increasing complicated and sensitive, controlling exposure of the substrate to the plasma is increasingly important. Ions generated within the plasma can have damaging effects on sensitive materials within device structures. The ions can modify the properties of device materials and adversely affect the performance of the overall structure.

SUMMARY

A substrate processing system includes an upper chamber and a gas delivery system to supply a gas mixture to the upper chamber. An RF generator generates plasma in the upper chamber. A lower chamber includes a substrate support. A dual ion filter is arranged between the upper chamber and the lower chamber. The dual ion filter includes an upper filter including a first plurality of through holes configured to filter ions. A lower filter includes a second plurality of through holes configured to control plasma uniformity.

In other features, a diameter of the first plurality of through holes of the upper filter is less than a diameter of the second plurality of through holes of the lower filter. A number of the first plurality of through holes of the upper filter is greater than a number of the second plurality of through holes of the lower filter. The upper filter and the lower filter are connected to a reference potential selected from a group consisting of ground, a positive DC reference and a negative DC reference.

In other features, the first plurality of through holes of the upper filter have a first diameter in a range from 0.5 mm to 1.5 mm. A number of the first plurality of through holes are in a range from 5,000 to 50,000. The second plurality of through holes of the upper filter have a first diameter in a range from 1 mm to 4 mm. A number of the first plurality of through holes are in a range from 100 to 10,000.

In other features, the upper filter is arranged parallel to the lower filter. The upper filter is spaced from the lower filter by a predetermined gap in a range from 1 mm to 50 mm. At least one of the upper filter and the lower filter includes an inner cooling plenum to receive a cooling fluid.

In other features, a spacing ring is arranged between the upper filter and the lower filter. A fastener is made of a conducting material and connects the upper filter to the lower filter through a bore in the spacing ring. A protective cover is made of a plasma-resistant material and is arranged on a plasma-facing surface of the fastener.

In other features, an inductive coil is arranged around an outer surface of the upper chamber. The RF generator generates plasma in the upper chamber by supplying an RF signal to the inductive coil while the gas mixture is supplied by the gas delivery system.

In other features, the upper filter is connected to a reference potential selected from a group consisting of ground, a positive DC reference and a negative DC reference. The lower filter is connected to a reference potential selected from a group consisting of ground, a positive DC reference and a negative DC reference. The upper filter and the lower filter have a different bias.

In other features, the upper filter and the lower filter are made of aluminum and include a coating selected from a group consisting of nickel and yttria. In other features, the lower filter is made of aluminum and includes a yttria coating on a plasma-facing surface thereof and a nickel coating on a substrate-facing side thereof. The upper filter has a thickness in a range from 2 to 5 mm and the lower filter has a thickness in a range from 5 to 15 mm.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 3A, 3B and 4 are enlarged cross-sectional views of examples of the dual ion filter according to the present disclosure;

DETAILED DESCRIPTION

Substrate processing systems and methods according to the present disclosure include a dual ion filter arranged between an upper chamber region where plasma is generated and a lower chamber region where the substrate is located. The dual ion filter includes an upper filter that is configured to predominantly filter ions generated by the plasma. The lower filter is configured to predominantly control plasma uniformity. The dual ion filter reduces ions reaching the substrate by increasing the electrically grounded area to capture ions, increasing surface area to help recombination, and decreasing the mean free path to assist with recombination.

Figure 1:
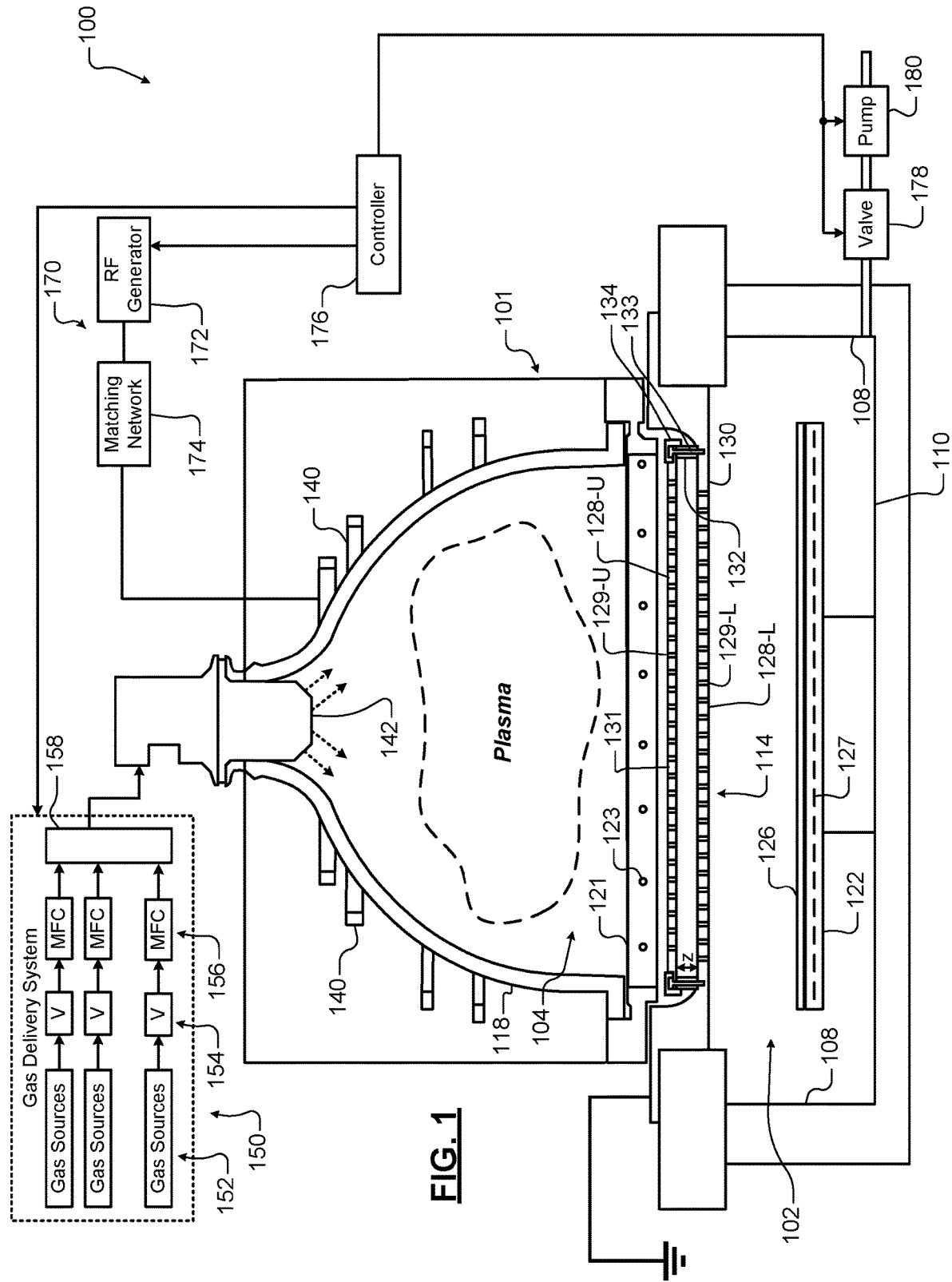
FIGS. 1 and 2 are functional block diagrams of examples of substrate processing systems including a dual ion filter according to the present disclosure.
Figure 2:
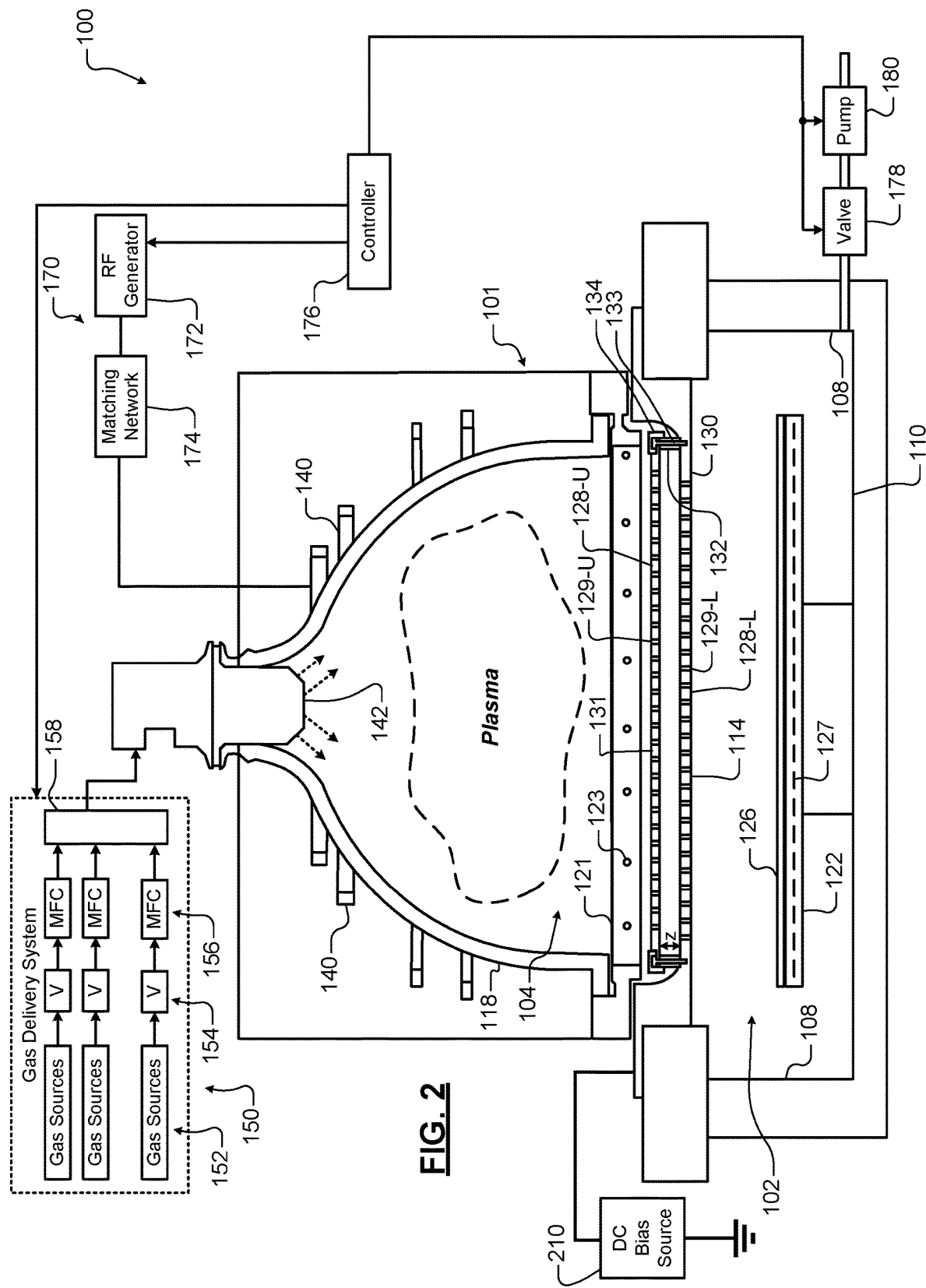

Referring now to FIGS. 1 and 2, a substrate processing system 100 includes a substrate processing chamber 101. Although the substrate processing chamber 101 is shown as an inductively coupled plasma (ICP) based system, the examples disclosed herein may be applied to other types of substrate processing systems such as transformer coupled plasma (TCP) or downstream plasma systems.

The substrate processing chamber 101 includes a lower chamber region 102 and an upper chamber region 104. The lower chamber region 102 is defined by chamber sidewall surfaces 108, a chamber bottom surface 110 and a lower surface of a dual ion filter 114.

The upper chamber region 104 is defined by an upper surface of the dual ion filter 114 and an inner surface of a dome 118. In a TCP based system, the dome 118 may be replaced by a cylindrical-shaped structure. In some examples, the dome 118 rests on a first annular support 121 including one or more spaced holes 123 for delivering process gas to the upper chamber region 104. In some examples, the process gas is delivered by the one or more spaced holes 123 in an upward direction at an acute angle relative to a plane including the dual ion filter 114, although other angles/directions may be used. A gas flow channel in the first annular support 121 may be used to supply gas to the one or more spaced holes 123.

The substrate support 122 is arranged in the lower chamber region 102. In some examples, the substrate support 122 includes an electrostatic chuck (ESC), although other types of substrate supports can be used. A substrate 126 is arranged on an upper surface of the substrate support 122 during processing such as etching. In some examples, a temperature of the substrate 126 may be controlled by heating elements (or a heater plate) 127, an optional cooling plate with fluid channels and one or more sensors (not shown), although any other suitable substrate support temperature control system may be used.

In some examples, the dual ion filter 114 includes a lower filter 128-L with $N_1$ through holes 129-L each having a diameter $D_1$. The dual ion filter 114 includes an upper filter 128-U with $N_2$ through holes 129-U each having a second diameter $D_2$. In some examples, the lower and upper filters 128-L and 128-U include planar portions 130 and 131, respectively, that are arranged parallel to one another. In some examples, the lower and upper filters 128-L and 128-U are connected to a reference potential such as ground (FIG. 1), a positive DC reference potential (FIG. 2), or negative DC reference potential (FIG. 2). The upper and lower filters 128-U and 128-L can be biased by the same reference potential or different reference potentials. As will be described further below, the lower and upper filters 128-L and 128-U may include an internal plenum to receive cooling fluid such as a liquid or gas.

The upper filter 128-U may be supported above the lower filter 128-L by an annular ring 132 (or supported in a similar spaced relationship in another manner). Alternately, the lower filter 128-L may be supported below the upper filter 128-U by the annular ring 132 (or supported in a similar spaced relationship in another manner). In still other examples, the upper filter 128-U and the lower filter 128-L are independently supported by chamber walls or one or more other processing chamber components in a spaced relationship.

In some examples, the annular ring 132 is made of a non-conducting material. A fastener 133 may be used to provide physical and electrical connections between the lower and upper filters 128-L and 128-U. In some examples, the fastener 133 is made of metal such as bare aluminum, although other materials can be used. A protective cover 134 may be arranged over the fastener 133. In some examples, the protective cover 134 is made of a plasma resistant material such as ceramic, or a non-plasma resistant material that is coated with a plasma resistant material.

One or more inductive coils 140 may be arranged around an outer portion of the dome 118. When energized, the one or more inductive coils 140 create an electromagnetic field inside of the dome 118. In some examples, an upper coil and a lower coil are used. A gas injector 142 injects one or more gas mixtures from a gas delivery system 150. The gas delivery system 150 includes one or more gas sources 152, one or more valves 154, one or more mass flow controllers (MFCs) 156, and a mixing manifold 158, although other types of gas delivery systems may be used. Suitable gas delivery systems are shown and described in commonly assigned U.S. patent application Ser. No. 14/945,680, entitled "Gas Delivery System" and filed on Dec. 4, 2015, which is hereby incorporated by reference in its entirety. Suitable single or dual gas injectors and other gas injection locations are shown and described in commonly assigned U.S. Provisional Patent Application Ser. No. 62/275,837, entitled "Substrate Processing System with Multiple Injection Points and Dual Injector" and filed on Jan. 7, 2016, which is hereby incorporated by reference in its entirety.

In some examples, the gas injector 142 includes a center injection location that directs gas in a downward direction and one or more side injection locations that inject gas at one or more angles with respect to the downward direction. In some examples, the gas delivery system 150 delivers a first portion of the gas mixture at a first flow rate to the center injection location and a second portion of the gas mixture at a second flow rate to the side injection location(s) of the gas injector 142. In other examples, different gas mixtures are delivered by the gas injector 142. In some examples, the gas delivery system 150 delivers tuning gas to other locations in the processing chamber.

A plasma generator 170 may be used to generate RF power that is output to the one or more inductive coils 140. Plasma 190 is generated in the upper chamber region 104. In some examples, the plasma generator 170 includes an RF generator 172 and a matching network 174. The matching network 174 matches an impedance of the RF generator 172 to the impedance of the one or more inductive coils 140. A valve 178 and a pump 180 may be used to control pressure inside of the lower and upper chamber regions 102, 104 and to evacuate reactants.

A controller 176 communicates with the gas delivery system 150, the valve 178, the pump 180, and/or the plasma generator 170 to control flow of process gas, purge gas, RF plasma and chamber pressure. In some examples, plasma is sustained inside the dome 118 by the one or more inductive coils 140. One or more gas mixtures are introduced from a top portion of the substrate processing chamber 101 using the gas injector 142 (and/or holes 123).

Referring now to FIG. 3A, the lower filter 128-L and the upper filter 128-U are shown in further detail. The lower filter 128-L includes a planar portion 310 that includes the through holes 129-L. An annular body portion 314 is connected to the planar portion 310. An annular projecting portion 318 extends radially outwardly from the annular body portion 314. The annular ring 132 rests on an upper surface of the lower filter 128-L. The annular ring 132 includes one or more bores that receive the fastener 133. In some examples, three or more fasteners 133 are used at spaced locations around a periphery of the lower filter 128-L.

The upper filter 128-U includes a planar portion 330 that includes the through holes 129-U. A radially outer edge 334 of the planar portion 330 is supported by an upper surface of the annular ring 132. The radial outer edge 334 may include a bore 336 for receiving the fastener 133. The fastener 133 provides an electrical connection between the upper filter 128-U and the lower filter 128-L. The protective cover 134 is arranged over the fastener 133 to protect the fastener 133 from the plasma.

In some examples, the number and diameter of the though holes 129-U and 129-L are different. The lower filter 128-L includes NL through holes 129-L having a diameter DL. The upper filter 128-U includes Nu through holes 129-U having a second diameter Du. In some examples, the number Nu of the through holes 129-U is greater than the number NL of the through holes 129-L. In some examples, the diameter Du of the through holes 129-U is less than the diameter DL of through holes 129-L. In some examples, the diameter DL of the lower filter 128-L is in a range from 1 mm to 4 mm. In some examples, the diameter Du of the upper filter 128-U is in a range from 0.5 mm to 1.5 mm. In some examples, the number NL of through holes 129-L is in a range from 100 to 10000. In some examples, the number Nu of through holes 129-U is in a range from 5,000 to 50,000.

In some examples, the through holes 129-U and 129-L are uniformly distributed. In some examples, the through holes 129-L are vertically misaligned relative to the through holes 129-U. However in some examples, due to the large number of through holes 129-U and the uniform spacing thereof, some of the through holes 129-U may be partially or fully vertically aligned with the through holes 129-L. In some examples, the gap z is in a range from 1 mm to 50 mm.

In some examples, the upper and lower filters 128-U and 128-L are made of a conducting material such as aluminum. In some examples, the upper and lower filters 128-U and 128-L include a physical vapor deposition (PVD), chemical vapor deposition (CVD) or atomic layer deposition (ALD) coating. Example coating materials are selected from a group consisting of yttria, anodized Al, bare Al or nickel. In some examples, the upper filter 128-U and the lower filter 128-L are made of 6061 T6 aluminum with a yttria coating. In some examples, the lower filter 128-L is made of 6061 T6 aluminum with a yttria coating on a plasma-facing side thereof and a nickel coating on a substrate-facing side thereof. In some examples, the coating has a thickness in a range from 500 nm to 500 µm. In some examples, the upper filter 128-U has a thickness in a range from 2 mm to 5 mm and the lower filter 128-L has a thickness in a range from 5 to 15 mm.

As can be appreciated, there are various different ways for arranging the upper and lower filters 128-U and 128-L in the processing chamber in addition to the ring shown in FIG. 3A. Referring now to FIG. 3B, the upper filter 128-U can be attached to another location in the processing chamber rather than resting on the lower filter 128-L as shown in FIG. 3A. In FIG. 3B, the upper filter 128-U is arranged on a ring 370 resting on a ledge located on the processing chamber sidewall (or is attached to a processing chamber sidewall). In some examples, the ring 370 is made of a conductive material. In other examples, the ring 370 is made of a non-conducting material and includes a passage 372 to receive an insulated conductor 374 to provide a connection to a reference potential.

In some examples, the upper and lower filters 128-U and 128-L are biased by different potentials. For example, the upper filter 128-U can be biased by a first DC reference or ground 380 and the lower filter 128-L can be biased by a second DC reference or ground 382. In some examples, the DC reference is in a range of 0 to +/−20 VDC. In some examples, the DC reference is in a range of 0 to +/−10 VDC.

Referring now to FIG. 4, one or both of the lower and upper filters 128-L and 128-U may define plenums 410-L and 410-U for receiving a cooling fluid such as a liquid or gas to cool the lower and upper filters 128-L and 128-U, respectively. In some examples, the lower filter 128-L is cooled to suppress radical recombination. In some examples, the upper filter 128-U is cooled since it is in contact with the plasma.

Fluid from a fluid source 440 is supplied by a valve 444 and a pump 446 to a conduit 448 connected to the annular body portion 314. A passage 440 in the annular body portion 314 is connected to a plenum 444. The plenum 444 is connected to the plenums 410-L and 410-U. The plenum 410-U is connected to the plenum 444 by a passage 454 formed in a conduit 456 arranged between the lower filter 128-L and the upper filter 128-U. While a specific cooling system arrangement is shown, other arrangements may be used to supply fluid to the plenums 410-L and 410-U.

In some examples, if the upper filter 128-U is cooled, the upper filter 128-U has a thickness in a range from 10 mm to 15 mm. In some examples, if the lower filter 128-L is cooled, the lower filter 128-L has a thickness in a range from 10 to 20 mm. When cooled, the increased thickness allows sufficient room to accommodate the plenum.

Figure 5:
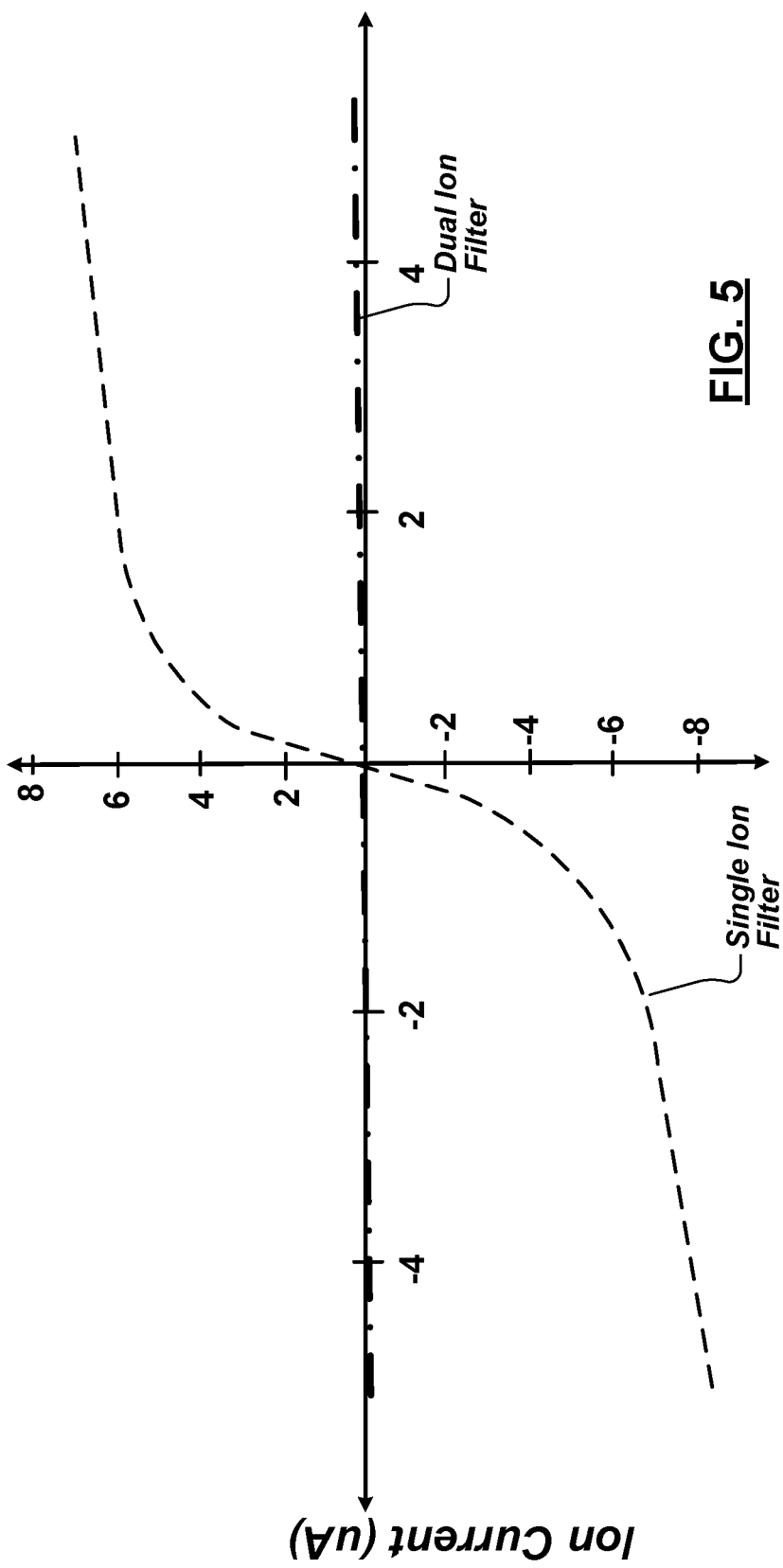
FIG. 5 is a graph illustrating charge receptor measurement of a single ion filter and a dual ion filter according to the present disclosure.

Referring now to FIG. 5, ion current is shown as a function of DC bias voltage for a single ion filter and a dual ion filter according to the present disclosure. A current detecting probe with DC bias voltage capability was used in the processing chamber to measure ion current to a detection limit of 0.01 µA. With this arrangement, ion and electron current was measured as a function of DC voltage for single and dual ion filter arrangements. As can be seen in Table I below, the single ion filter has 1.9 uA at zero voltage. Even without a DC bias assisting ion attraction, ions are already leaking through the showerhead and present on the wafer surface. Note that with the single ion filter, ion induced voltage does not trend dramatically with variations in hole size and pattern. However, the dual ion filter has a 100X gain in voltage performance without compromising ER.

TABLE I

| Ion Filter Configuration | Max Ion Flux at 0 V and 5 V (μA) | Etch Rate | Non-uniformity |
|---|---|---|---|
| Single Ion Filter with 3.5 mm holes | 1.9/6.9 | 465 | 7.1 |
| Single Ion Filter with <1 mm holes (23k) | 0.6/1.1 | 483 | 10.8 |
| Dual ion filter Upper holes <1 mm; Lower larger | 0.02/0.29 | 475 | 5.1 |

The present disclosure provides improved performance by decoupling ion filtering and reactant flux. The upper filter predominantly performs ion filtering. The lower filter predominantly controls etch rate and percent non-uniformity. Also, the volume between the upper and lower filters allows increased residence time which helps to reduce ions via collisions.

Figure 6:
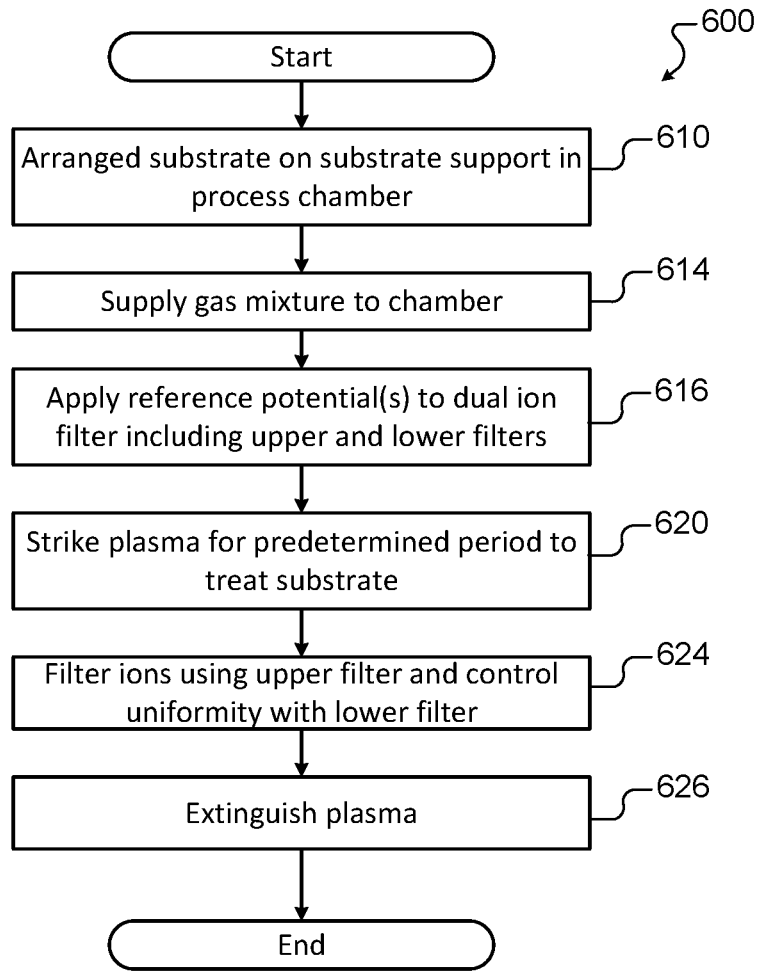
FIG. 6 is a flowchart of an example of a method for using a dual ion filter to filter ions in a processing chamber according to the present disclosure.

Referring now to FIG. 6, a method 600 for using a dual ion filter according to the present disclosure to filter ions during treatment of a substrate is shown. At 610, a substrate is arranged on a substrate support in the processing chamber. At 614, a process gas mixture is supplied to the processing chamber. At 616, a reference potential is applied to the dual ion filter including the lower and upper filters. At 620, plasma is struck in the processing chamber for a predetermined period to treat the substrate. At 624, ions are predominantly filtered using the upper filter and the plasma uniformity is controlled by the lower filter. At 626, the plasma is extinguished after the predetermined period.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, an ion beam etcher (IBE), a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system, comprising:
   an upper chamber;
   a gas delivery system to supply a gas mixture to the upper chamber;
   an RF generator to generate plasma in the upper chamber;
   a lower chamber including a substrate support; and
   a dual ion filter arranged between the upper chamber and the lower chamber, the dual ion filter including:
     an upper filter including a first plurality of through holes configured to filter ions; and
     a lower filter including a second plurality of through holes configured to control plasma uniformity;
   wherein a diameter of the first plurality of through holes of the upper filter is less than a diameter of the second plurality of through holes of the lower filter; and
   wherein a number of the first plurality of through holes of the upper filter is greater than a number of the second plurality of through holes of the lower filter.

2. The substrate processing system of claim 1, wherein the upper filter and the lower filter are connected to a reference potential selected from a group consisting of ground, a positive DC reference and a negative DC reference.

3. The substrate processing system of claim 1, wherein the first plurality of through holes of the upper filter have a first diameter in a range from 0.5 mm to 1.5 mm.

4. The substrate processing system of claim 3, wherein a number of the first plurality of through holes are in a range from 5,000 to 50,000.

5. The substrate processing system of claim 1, wherein the second plurality of through holes of the upper filter have a first diameter in a range from 1 mm to 4 mm.

6. The substrate processing system of claim 5, wherein a number of the first plurality of through holes are in a range from 100 to 10,000.

7. The substrate processing system of claim 1, wherein the upper filter is arranged parallel to the lower filter and wherein the upper filter is spaced from the lower filter by a predetermined gap in a range from 1 mm to 50 mm.

8. The substrate processing system of claim 1, wherein at least one of the upper filter and the lower filter includes an inner cooling plenum to receive a cooling fluid.

9. The substrate processing system of claim 1, further comprising a spacing ring arranged between the upper filter and the lower filter.

10. The substrate processing system of claim 9, further comprising:
    a fastener made of a conducting material and connecting the upper filter to the lower filter through a bore in the spacing ring; and
    a protective cover made of a plasma-resistant material and arranged on a plasma-facing surface of the fastener.

11. The substrate processing system of claim 1, further comprising an inductive coil arranged around an outer surface of the upper chamber, wherein the RF generator generates plasma in the upper chamber by supplying an RF signal to the inductive coil while the gas mixture is supplied by the gas delivery system.

12. The substrate processing system of claim 1, wherein:
    the upper filter is connected to a reference potential selected from a group consisting of ground, a positive DC reference and a negative DC reference;
    the lower filter is connected to a reference potential selected from a group consisting of ground, a positive DC reference and a negative DC reference; and
    the upper filter and the lower filter have a different bias.

13. The substrate processing system of claim 1, wherein the upper filter and the lower filter are coated with a coating comprising yttria.

14. The substrate processing system of claim 1, wherein the upper filter has a thickness in a range from 2 to 5 mm and the lower filter has a thickness in a range from 5 to 15 mm.

15. The substrate processing system of claim 1, wherein at least one of the upper filter and the lower filter comprises a plenum to receive a cooling fluid.

* * * * *